US010673383B2

(12) United States Patent
Powell et al.

(10) Patent No.: US 10,673,383 B2
(45) Date of Patent: Jun. 2, 2020

(54) CLOCK CIRCUIT AND METHOD FOR RECALIBRATING AN INJECTION OSCILLATOR COUPLED TO KICK-START A CRYSTAL OSCILLATOR

(71) Applicant: Silicon Laboratories Inc., Austin, TX (US)

(72) Inventors: Matthew Powell, Austin, TX (US); Sudipta Sarkar, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 23 days.

(21) Appl. No.: 16/136,739

(22) Filed: Sep. 20, 2018

(65) Prior Publication Data

US 2020/0099337 A1  Mar. 26, 2020

(51) Int. Cl.
*H03B 5/06* (2006.01)
*H03B 5/36* (2006.01)
*H03L 3/00* (2006.01)
*H03K 21/38* (2006.01)

(52) U.S. Cl.
CPC ............. *H03B 5/06* (2013.01); *H03B 5/366* (2013.01); *H03K 21/38* (2013.01); *H03L 3/00* (2013.01); *H03B 2200/0094* (2013.01)

(58) Field of Classification Search
CPC .. H03B 5/06; H03B 5/366; H03B 2200/0094; H03K 21/38; H03L 3/00
See application file for complete search history.

(56) References Cited

U.S. PATENT DOCUMENTS

| 4,704,587 A | 11/1987 | Ouyang et al. |
| 5,892,408 A | 4/1999 | Binder |
| 6,191,662 B1 | 2/2001 | Volk |
| 6,747,522 B2 | 6/2004 | Pietruszynski |
| 7,417,512 B2 | 8/2008 | Lee |
| 7,482,888 B1 | 1/2009 | Kleveland |

(Continued)

OTHER PUBLICATIONS

Iguchi et al., "92% Start-Up Time Reduction by Variation-Tolerant Chirp Injection (CI) and Negative Resistance Booster (NRB) in 39MHz Crystal Oscillator", IEEE, 2 pgs. (2014).

(Continued)

*Primary Examiner* — Jeffrey M Shin
(74) *Attorney, Agent, or Firm* — Egan Peterman Enders Huston

(57) ABSTRACT

Embodiments of clock circuits disclosed herein include a crystal oscillator circuit, an injection oscillator coupled to kick-start the crystal oscillator circuit and a digital frequency calibration circuit coupled to recalibrate the injection oscillator. The crystal oscillator circuit is configured to generate a clock signal at a resonant frequency. The injection oscillator is coupled to supply an oscillation signal at an injection frequency to the crystal oscillator circuit to reduce a start-up time of the crystal oscillator circuit. The digital frequency calibration circuit is coupled to receive the resonant frequency and the injection frequency as inputs, and configured to supply a digital control signal to the injection oscillator to set the injection frequency of the injection oscillator substantially equal to the resonant frequency of the crystal oscillator circuit. Methods are provided herein to recalibrate the injection frequency of an injection oscillator over time, temperature and/or supply voltage.

20 Claims, 7 Drawing Sheets

(56) References Cited

U.S. PATENT DOCUMENTS

| | | | |
|---|---|---|---|
| 9,692,354 B2 | 6/2017 | Elgaard | |
| 2015/0333694 A1* | 11/2015 | Griffith | .................... H03B 5/06 |
| | | | 331/48 |
| 2016/0373056 A1 | 12/2016 | Kumar | |
| 2017/0237441 A1* | 8/2017 | Peltonen | .................... H03L 5/00 |
| | | | 331/158 |
| 2018/0167876 A1* | 6/2018 | McFarthing | ...... H04W 52/0209 |

OTHER PUBLICATIONS

Griffith et al., "A 24MHz Crystal Oscillator With Robust Fast Start-Up using Dithered Injection", ISSCC, 3 pgs. (2016).

* cited by examiner

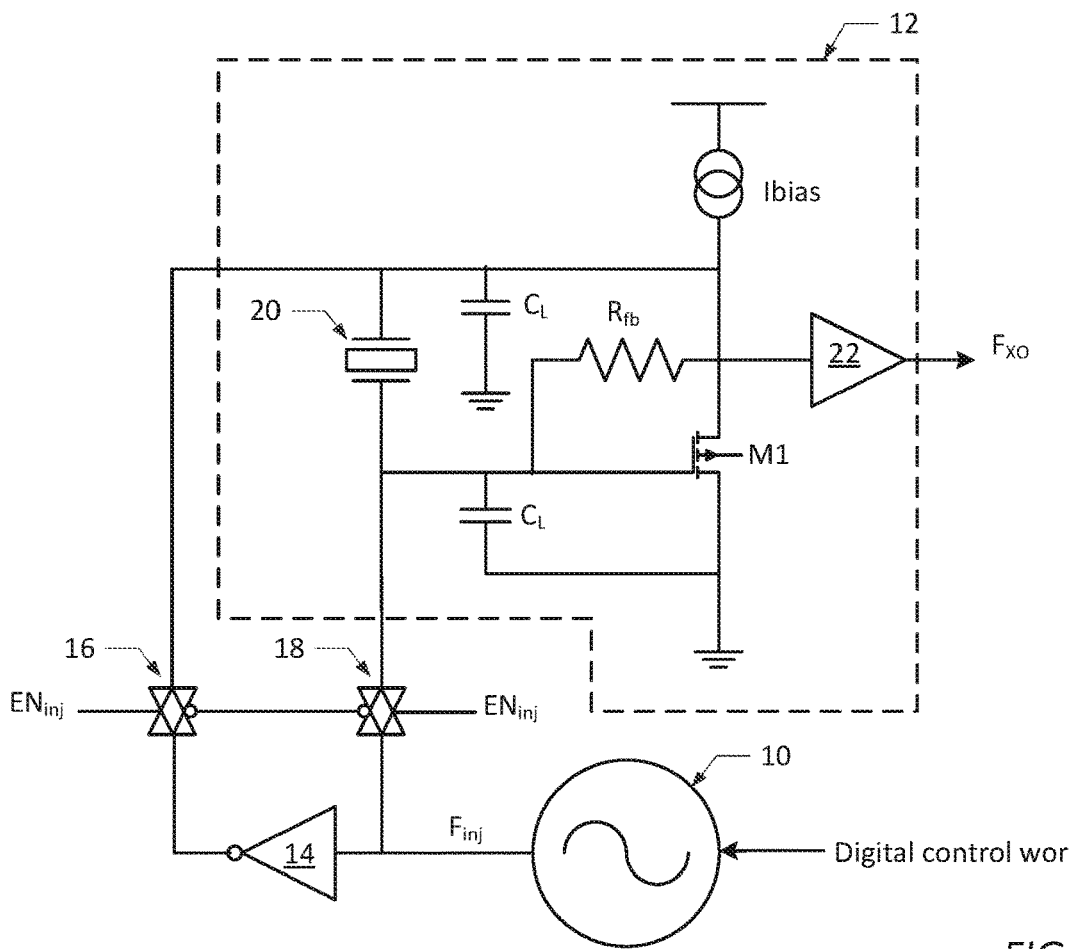
FIG. 1
(Prior Art)
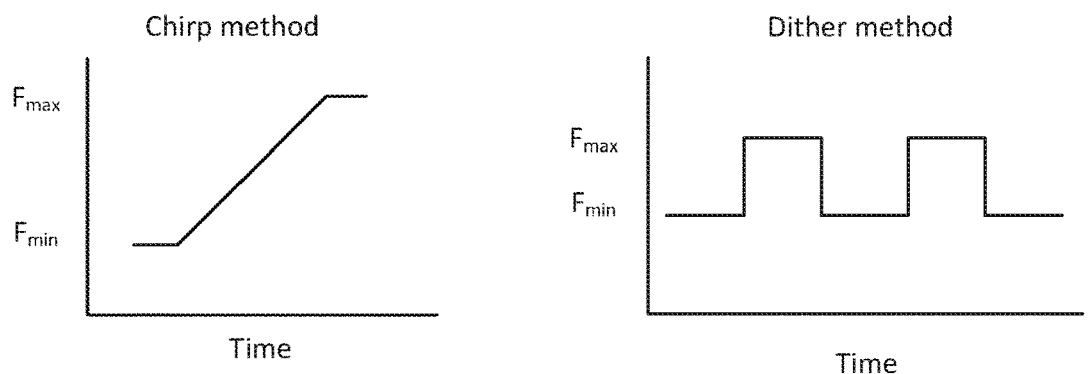
FIG. 2
(Prior Art)
FIG. 3
(Prior Art)

CLOCK CIRCUIT AND METHOD FOR RECALIBRATING AN INJECTION OSCILLATOR COUPLED TO KICK-START A CRYSTAL OSCILLATOR

BACKGROUND

1. Field of the Disclosure

This disclosure relates to clock circuits and, more particularly, to clock circuits and methods to recalibrate an injection oscillator coupled to kick-start a crystal oscillator.

2. Description of the Relevant Art

The following descriptions and examples are provided as background only and are intended to reveal information that is believed to be of possible relevance to the present disclosure. No admission is necessarily intended, or should be construed, that any of the following information constitutes prior art impacting the patentable character of the subject matter claimed herein.

Radio frequency (RF) transceivers (as well as other electronic systems and circuits) often require a high precision and low noise reference clock source for normal operation. Such a clock source may be provided, in some cases, by a crystal oscillator circuit. In low power applications, it is common for an RF transceiver to spend much of its time in a low power sleep mode. During low power sleep modes, the crystal oscillator circuit is frequently turned off to reduce power consumption of the RF transceiver.

Crystal oscillator circuits have significantly higher Q-factors (e.g., $10^3$ to $10^6$) than alternative clock sources (e.g., 0.1 to 100) operating at similar frequencies, such as a ring oscillator or a relaxation oscillator. The higher the Q-factor, the longer it takes for the oscillation signal generated by the oscillator to reach its final amplitude, resulting in a longer start-up time. Waiting for a crystal oscillator to start up can be a significant source of power consumption in a low power radio design, and may create additional system design hurdles in applications where the radio needs to be on during a specific window to receive or transmit packets.

One method that has been proposed to reduce the start-up time of a crystal oscillator circuit is to use a low-Q injection oscillator, which is coupled to provide an oscillation signal to "kick-start" the crystal oscillator. However, the start-up time of the crystal oscillator circuit may be reduced only if the injection frequency of the injection oscillator is maintained very close to the resonant frequency of the crystal oscillator. For example, the start-up time of a crystal oscillator circuit may be reduced if the injection frequency is maintained within ±0.5% of the resonant frequency of the crystal oscillator circuit. For best results, the injection frequency is preferably maintained within ±0.25% (or less) of the resonant frequency.

FIG. 1 (Prior art) is a simplified circuit diagram of an injection oscillator 10, which is coupled for supplying an oscillation signal at an injection frequency ($F_{inj}$) to kick-start a crystal oscillator circuit 12. In the simple circuit diagram shown in FIG. 1 (Prior Art), injection oscillator 10 is coupled for supplying the injection frequency, $F_{inj}$, to an inverter 14 and a pair of multiplexors 16 and 18, which are coupled for supplying an injection current to crystal oscillator circuit 12 when enabled via an enable signal ($EN_{inj}$). The crystal oscillator circuit 12 shown in FIG. 1 (Prior Art), which includes a piezoelectric resonator 20, transistor M1, bias resistor Rfb, bias current Ibias, load capacitors $C_L$ and comparator 22, is configured to operate at a resonant frequency ($F_{XO}$). To reduce the start-up time of crystal oscillator circuit 12, the injection frequency, $F_{inj}$, supplied by injection oscillator 10 should be set as close as possible to the resonant frequency, $F_{XO}$, of crystal oscillator circuit 12.

Unfortunately, injection oscillators commonly used to kick-start crystal oscillator circuits are unable to maintain a sufficiently accurate injection frequency to produce the desired result. In practice, the frequency accuracy of commonly used injection oscillators, such as relaxation and ring oscillators, are typically around 1-2% when the effects of temperature variation and/or component aging are considered. Supply sensitivity is another concern that affects the frequency accuracy of the injection oscillator.

Various methods have been proposed for modulating the injection frequency, $F_{inj}$, of the injection oscillator to attempt to excite the crystal oscillator circuit at the correct frequency. As shown in FIG. 1 (Prior Art), for example, a digital control word can be supplied to injection oscillator 10 to modulate the injection frequency, $F_{inj}$. The digital control word may modulate the injection frequency, $F_{inj}$, using a variety of different methods or modulation schemes. For example, a chirp method may be used to continuously sweep the injection frequency over a range of frequencies between $F_{min}$ and $F_{max}$, as shown in FIG. 2 (Prior Art). In FIG. 3 (Prior Art), the injection frequency is dithered between a minimum frequency, $F_{min}$, and a maximum frequency, $F_{max}$.

Although the modulation schemes shown in FIG. 2 (Prior Art) and FIG. 3 (Prior Art) improve start-up performance to some degree, there are fundamental limits to what can be achieved for a given accuracy of the injection oscillator. In practice, it is difficult to design an injection oscillator that achieves better than 1% frequency accuracy, even if the injection oscillator is calibrated perfectly at a single temperature during production test. The limitation of frequency accuracy places a fundamental limit on how much energy can be deterministically injected into the crystal oscillator circuit, and therefore, limits how quickly start-up can be achieved, regardless of the modulation scheme employed.

Additional methods have also been proposed for adjusting the injection frequency of an injection oscillator over time to more closely match the resonant frequency of the crystal oscillator circuit. For example, U.S. Pat. No. 9,692,354 describes an oscillator circuit having a low-Q oscillator arranged for kick-starting a high-Q crystal oscillator. In the '354 patent, the low-Q oscillator is placed in a phase locked loop with the crystal oscillator to provide the desired frequency adjustment. As such, the '354 patent discloses a complex frequency adjustment scheme that unnecessarily consumes power and area in the system design and increases cost/design effort. In addition, calibration time is increased in the frequency adjustment scheme disclosed in the '354 patent, due to the need to allow the PLL to settle.

SUMMARY

The following description of various embodiments of clock circuits and methods to recalibrate an injection oscillator coupled to kick-start a crystal oscillator is not to be construed in any way as limiting the subject matter of the appended claims.

Generally speaking, the present disclosure provides various embodiments of a clock circuit having a crystal oscillator circuit, an injection oscillator coupled to supply an oscillation signal at an injection frequency to kick-start the crystal oscillator circuit, and a digital frequency calibration circuit coupled to recalibrate the injection frequency of the injection oscillator. As described in more detail below, the digital frequency calibration circuit receives a resonant frequency from the crystal oscillator circuit and an injection frequency from the injection circuit, and supplies a digital control signal to the injection oscillator to set the injection frequency as close as possible to the resonant frequency. To ensure that the desired injection frequency is maintained with high frequency accuracy, the digital frequency calibration circuit disclosed herein updates the digital control signal supplied to the injection oscillator periodically over time. In some embodiments, the digital frequency calibration circuit disclosed herein may also update the digital control signal to account for changes in temperature and/or supply voltage. In doing so, the digital frequency calibration circuit ensures that the start-up time of the crystal oscillator circuit is not adversely affected by component aging (time) or variations in temperature or supply voltage. In addition to maintaining high frequency accuracy, the digital frequency calibration circuit described herein may be implemented entirely with digital elements (digital control logic) to minimize power consumption, area, cost, design effort and calibration time compared to prior art techniques.

According to one embodiment, a clock circuit disclosed herein may generally include a crystal oscillator circuit, an injection oscillator and a digital frequency calibration circuit. The crystal oscillator circuit may be configured to generate a clock signal at a resonant frequency, and the injection oscillator may be coupled to supply an oscillation signal at an injection frequency to the crystal oscillator circuit to reduce a start-up time of the crystal oscillator circuit. The digital frequency calibration circuit may be coupled to receive the resonant frequency and the injection frequency as inputs, and may be configured to supply a digital control signal to the injection oscillator to set the injection frequency of the injection oscillator substantially equal to the resonant frequency of the crystal oscillator circuit. As set forth in more detail below, the digital frequency calibration circuit may set the injection frequency substantially equal to the resonant frequency with a frequency accuracy of ±0.5% (or less) and preferably ±0.25% (or less).

As noted above, the digital frequency calibration circuit may consist entirely of digital control logic, which is coupled to receive the resonant frequency and the injection frequency and configured to generate the digital control signal. In one embodiment, the digital frequency calibration circuit may include a digital up/down counter, a subtractor, a multiplier and an adder. The digital up/down counter may be coupled to receive the resonant frequency and the injection frequency, and may be configured to generate a first digital signal corresponding to the injection frequency as measured by the resonant frequency. The subtractor may be coupled to an output of the digital up/down counter, and may be configured to generate a second digital signal corresponding to a difference between the first digital signal and a target count value supplied to the subtractor. The multiplier may be coupled to an output of the subtractor, and may be configured to generate a third digital signal by multiplying the second digital signal by a gain term supplied to the multiplier. The adder may be coupled to an output of the multiplier, and may be configured to update the digital control signal by adding the third digital signal to the digital control signal.

In some embodiments, the clock circuit may include decision circuitry, which is coupled to supply a recalibration signal to the digital frequency calibration circuit to update the digital control signal supplied to the injection oscillator. In one embodiment, the decision circuitry may supply the recalibration signal to the digital frequency calibration circuit if a time duration since a previous update of the digital control signal exceeds a specified limit. In another embodiment, the decision circuitry may supply the recalibration signal to the digital frequency calibration circuit if a temperature change associated with the clock circuit exceeds a specified limit.

In some embodiments, the injection oscillator may be an RC oscillator having a variable capacitor and a variable resistor. In one embodiment, a capacitance of the variable capacitor may be controlled by coarse trim bits, and a resistance of the variable resistor may be controlled by fine trim bits. In one particular embodiment, the capacitance of the variable capacitor may be controlled by coarse trim bits, which are determined during factory calibration and stored within a one-time programmable register. In such an embodiment, the digital control signal supplied to the injection oscillator may include the fine trim bits, which are supplied to the variable resistor to control the resistance.

According to another embodiment, a method is provided herein for recalibrating an injection frequency supplied by an injection oscillator to a crystal oscillator circuit. Such a method may include receiving the injection frequency of the injection oscillator and a resonant frequency of the crystal oscillator circuit. Next, the method may include increasing a first count value for each pulse of the injection frequency, decreasing a second count value for each pulse of the resonant frequency received during the receiving step and outputting the first count value when the second count value reaches zero. Next, the method may subtract a target count value from the first count value to generate a count difference, and may multiply the count difference by a gain term to generate an adjustment term. The method may generate an updated digital control signal by adding the adjustment term to a digital control signal previously supplied to the injection oscillator to control the injection frequency, and may supply the updated digital control signal to the injection oscillator to recalibrate the injection frequency. In doing so, the method may ensure that the injection frequency of the injection oscillator is set substantially equal to the resonant frequency of the crystal oscillator circuit.

In some embodiments, the method steps described above may be repeated to recalibrate the injection frequency. For example, the method steps may be repeated in response to at least one of the following: a time duration since the injection frequency was last calibrated exceeds a first specified limit, and a temperature change since the injection frequency was last calibrated exceeds a second specified limit. In some embodiments, the method may further include resetting a time count upon supplying the updated digital control signal to the injection oscillator to recalibrate the injection frequency of the injection oscillator, and repeating the method steps when the time count exceeds a specified limit. In some embodiments, the method may further include recording a temperature upon supplying the updated digital control signal to the injection oscillator to recalibrate the injection frequency of the injection oscillator, and repeating the method steps if the temperature changes more than a specified limit.

According to another embodiment, a transceiver circuit comprising a clock circuit is disclosed herein. The transceiver circuit may include a receive (RX) path coupled to receive radio frequency (RF) signals via an RF antenna, a transmit (TX) path coupled to transmit RF signals via the RF antenna, a local oscillator coupled for supplying one or more local clock signals to one or more components in the RX and TX paths, and a clock circuit coupled to provide a reference clock signal to the local oscillator. In one example embodiment, the RX may generally include a first amplifier, a pair of RX mixers and an analog-to-digital converter (ADC), and the TX path may generally include a digital-to-analog converter (DAC), a pair of TX mixers and a second amplifier. In such an embodiment, the local oscillator may be coupled to supply the one or more local clock signals to one or more of the RX mixers, TX mixers, ADC and DAC.

The clock circuit is configured to generate a clock signal, which may be supplied to the local oscillator as the reference clock signal and used to generate the one or more local clock signals. The clock circuit may be generally configured as described above. For example, the clock circuit may include a crystal oscillator circuit, an injection oscillator, a digital frequency calibration circuit, and decision circuitry. The crystal oscillator may be generally configured to generate the clock signal at a resonant frequency. The injection oscillator may be coupled to supply an oscillation signal at an injection frequency to the crystal oscillator circuit to reduce a start-up time of the crystal oscillator circuit. The digital frequency calibration circuit may be coupled to receive the resonant frequency and the injection frequency as inputs, and may be configured to supply a digital control signal to the injection oscillator to set the injection frequency of the injection oscillator substantially equal to the resonant frequency of the crystal oscillator circuit.

The decision circuitry may be coupled to supply a recalibration signal to the digital frequency calibration circuit to update the digital control signal supplied to the injection oscillator. In some embodiments, for example, the decision circuitry may supply a recalibration signal to the digital frequency calibration circuit in response to at least one of the following: a time duration since the injection frequency was last calibrated exceeds a first specified limit, a temperature change since the injection frequency was last calibrated exceeds a second specified limit, and a supply voltage change since the injection frequency was last calibrated exceeds a third specified limit. In doing so, the injection oscillator may be configured to provide a highly accurate injection frequency to the crystal oscillator that is not adversely affected by time (aging) and/or variations in temperature and/or supply voltage.

BRIEF DESCRIPTION OF THE DRAWINGS

Other objects and advantages of the disclosure will become apparent upon reading the following detailed description and upon reference to the accompanying drawings.

FIG. 1 (Prior Art) is a simplified circuit diagram of an injection oscillator coupled to supply an injection frequency to kick-start a crystal oscillator circuit;

FIG. 2 (Prior Art) is a timing diagram illustrating one method that may be used to modulate the injection frequency supplied by the injection oscillator to a crystal oscillator circuit;

FIG. 3 (Prior Art) is a timing diagram illustrating another method that may be used to modulate the injection frequency supplied by the injection oscillator to a crystal oscillator circuit;

Figure 4:
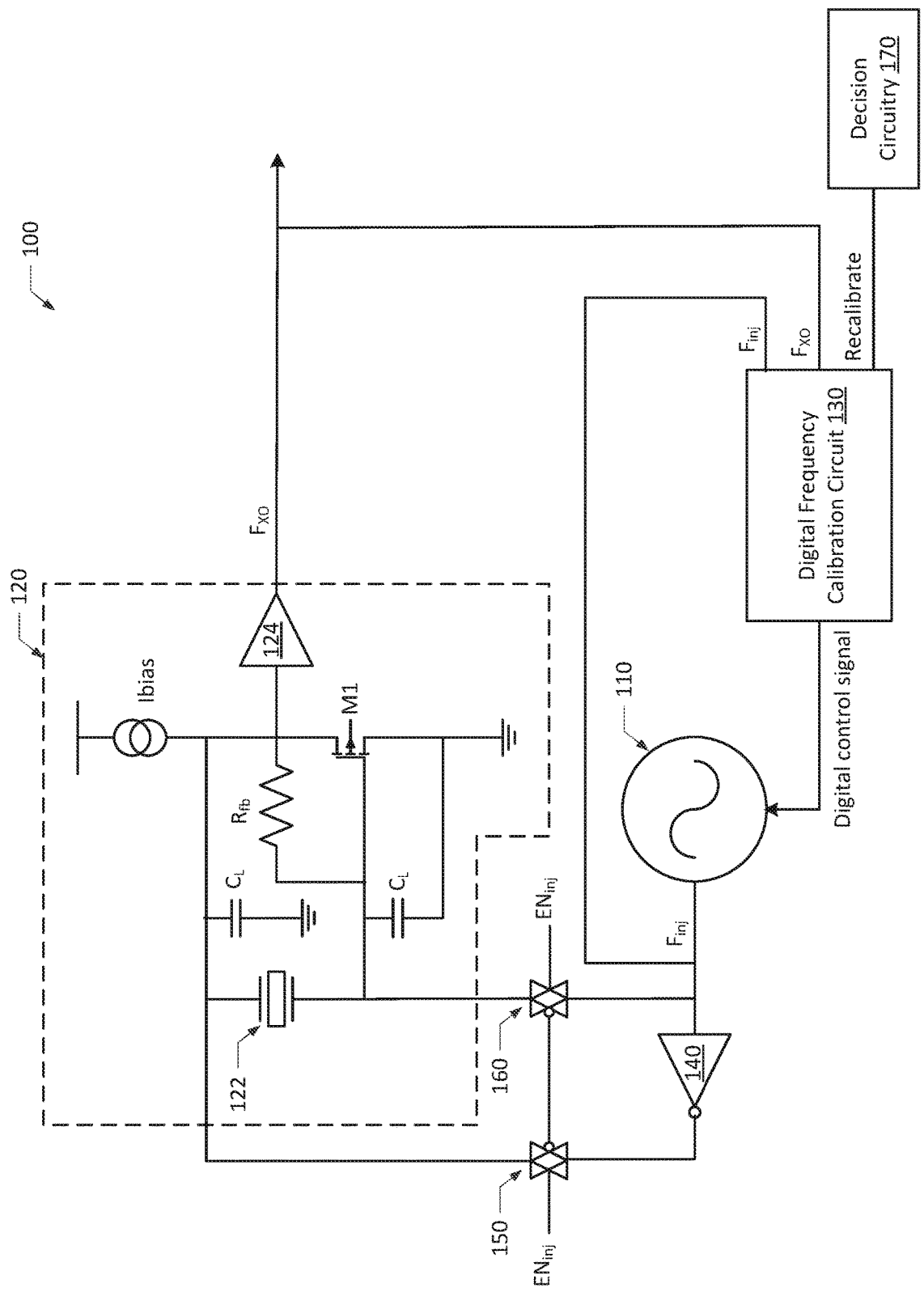
FIG. 4 is a simplified circuit diagram of a clock circuit including a crystal oscillator circuit, injection oscillator, digital frequency calibration circuit and decision circuitry, which may be used to recalibrate an injection frequency supplied by the injection oscillator to the crystal oscillator circuit in accordance with one embodiment of the present disclosure.

While the embodiments disclosed herein are susceptible to various modifications and alternative forms, specific embodiments thereof are shown by way of example in the drawings and will herein be described in detail. It should be understood, however, that the drawings and detailed description thereto are not intended to limit the disclosure to the particular form disclosed, but on the contrary, the disclosure is intended to cover all modifications, equivalents and alternatives falling within the spirit and scope of the present disclosure as defined by the appended claims.

DETAILED DESCRIPTION OF PREFERRED EMBODIMENTS

FIG. 4 provides a simplified circuit diagram of a clock circuit 100, according to one embodiment of the present disclosure. Similar to the clock circuit shown in FIG. 1 (Prior Art), clock circuit 100 includes an injection oscillator 110, which is coupled to supply an input oscillation signal at an injection frequency, $F_{inj}$, to kick-start a crystal oscillator circuit 120, which is configured to provide an output oscillation signal at a resonant frequency, $F_{XO}$. Injection oscillator 110 must have a fast startup time, usually achieved by having a low effective Q-factor. As such, injection oscillator 110 may be otherwise referred to herein as a fast-starting oscillator. Also, the injection oscillator 110 frequency must be able to be controlled by a digital control signal. Injection oscillator 110 may be implemented using any known type of oscillator including, but not limited to, ring oscillators or various forms of relaxation oscillators.

Like the clock circuit shown in FIG. 1 (Prior Art), injection oscillator 110 is coupled to supply the input oscillation signal (at injection frequency, $F_{inj}$) to an inverter 140 and a pair of multiplexors 150 and 160. Multiplexors 150 and 160 are coupled to supply an injection current to crystal oscillator circuit 120 at the injection frequency, $F_{inj}$, when enabled via an enable signal ($EN_{inj}$). In some embodiments, crystal oscillator circuit 120 may include a piezoelectric resonator 122 (e.g., a quartz crystal), transistor M1, bias resistor Rfb, bias current source (Ibias), load capacitors $C_L$ and comparator 124, similar to the crystal oscillator circuit 12 shown in FIG. 1 (Prior Art). It is noted, however, that crystal oscillator circuit 120 is not strictly limited to such an implementation and may be alternatively implemented with other crystal oscillator topologies (e.g., a Colpitts oscillator) whose start up can be accelerated by the injection of a signal with a precise frequency in other embodiments.

As noted above, the injection frequency, $F_{inj}$, supplied by injection oscillator 110 should be set as close as possible to the resonant frequency, $F_{XO}$, of crystal oscillator circuit 120 to minimize the start-up time of the crystal oscillator circuit. For example, the start-up time of crystal oscillator circuit 120 may be reduced if the injection frequency, $F_{inj}$, is within ±0.5% of the resonant frequency, $F_{XO}$. To minimize the start-up time, however, the injection frequency is preferably set within ±0.25% of the resonant frequency, and more preferably within ±0.10% of the resonant frequency. As noted above, the frequency accuracy of injection oscillator 110 is adversely affected by variations in process, temperature, voltage and time (component aging). In order to maintain a desired frequency accuracy, the injection frequency supplied by injection oscillator 110 is calibrated at production test and periodically recalibrated over time, and in some embodiments, with changes in temperature and/or supply voltage.

Unlike the clock circuit shown in FIG. 1 (Prior Art), digital frequency calibration circuit 130 is provided in clock circuit 100 to recalibrate the injection frequency, $F_{inj}$, supplied by injection oscillator 110 to the crystal oscillator circuit 120. As shown in FIG. 4, digital frequency calibration circuit 130 is coupled to receive the resonant frequency ($F_{XO}$) and the injection frequency ($F_{inj}$) as inputs, and is configured to output a digital control signal to injection oscillator 110 to recalibrate the injection frequency by setting the injection frequency substantially equal to the resonant frequency.

During operation of clock circuit 100, digital frequency calibration circuit 130 may update the digital control signal supplied to injection oscillator 110 upon receiving a recalibration signal (Recalibrate) from decision circuitry 170. In some embodiments, decision circuitry 170 may supply a recalibration signal to digital frequency calibration circuit 130 if a time duration since the last calibration exceeds a specified limit. In some embodiments, the decision to recalibrate the injection frequency may also account for changes in a temperature associated with the clock circuit and/or a supply voltage provided to the clock circuit. In some embodiments, decision circuitry 170 may also supply the recalibration signal to injection oscillator 110 and crystal oscillator circuit 120, since both oscillators may need to be restarted to perform the recalibration. Example implementations of digital frequency calibration circuit 130 and decision circuitry 170 are respectfully illustrated in FIGS. 5 and 6 and discussed in more detail below.

Figure 7:
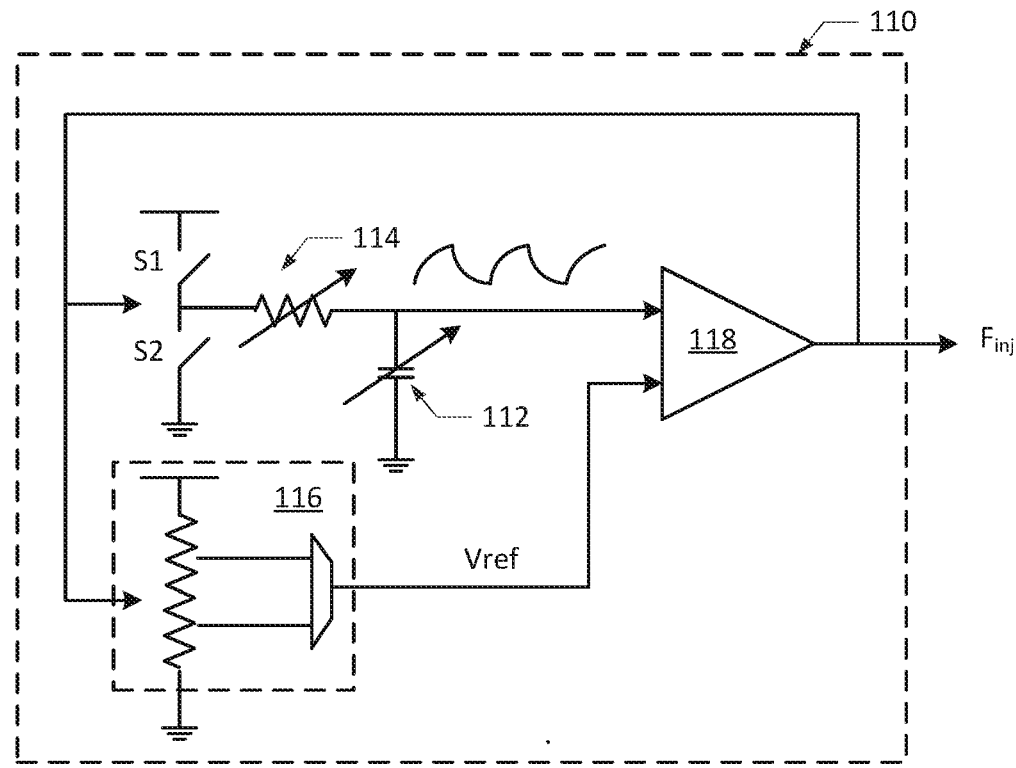
FIG. 7 is a simplified circuit diagram illustrating one example implementation of an injection oscillator (e.g., an RC oscillator), which may be included within the clock circuit shown in FIG. 4.

As noted above in the background section, methods have been proposed for adjusting the injection frequency of an injection oscillator over time to more closely match the resonant frequency of a crystal oscillator circuit. In U.S. Pat. No. 9,692,354, for example, a low-Q oscillator is placed in a phase locked loop (PLL) with a high-Q crystal oscillator to adjust the injection frequency provided by the low-Q oscillator to the high-Q crystal oscillator. In addition to the known disadvantages of the clock circuit disclosed in the '354 patent (e.g., unnecessary power and area consumption, as well as increased cost, design effort and calibration time), the real-time frequency control loop described in the '354 patent is avoidable if the injection oscillator demonstrates a stable and linear relationship between change in injection frequency and change in the digital control signal needed to effectuate such frequency change. One embodiment of an injection oscillator 110 having such a relationship is illustrated in FIG. 7 and described in more detail below.

Providing a suitable injection oscillator 110 within clock circuit 100 enables the digital frequency calibration circuit 130 disclosed herein to use a much simpler frequency control loop to recalibrate the injection frequency of injection oscillator 110. Compared to the PLL implementation disclosed in the '354 patent, digital frequency calibration circuit 130 uses only simple digital elements to measure the frequency difference between the resonant frequency ($F_{XO}$) and injection frequency ($F_{inj}$) and calculate an updated digital control signal. The digital elements used within digital frequency calibration circuit 130 are easy to design, consume very little area and have negligible cost in power consumption.

Figure 5:
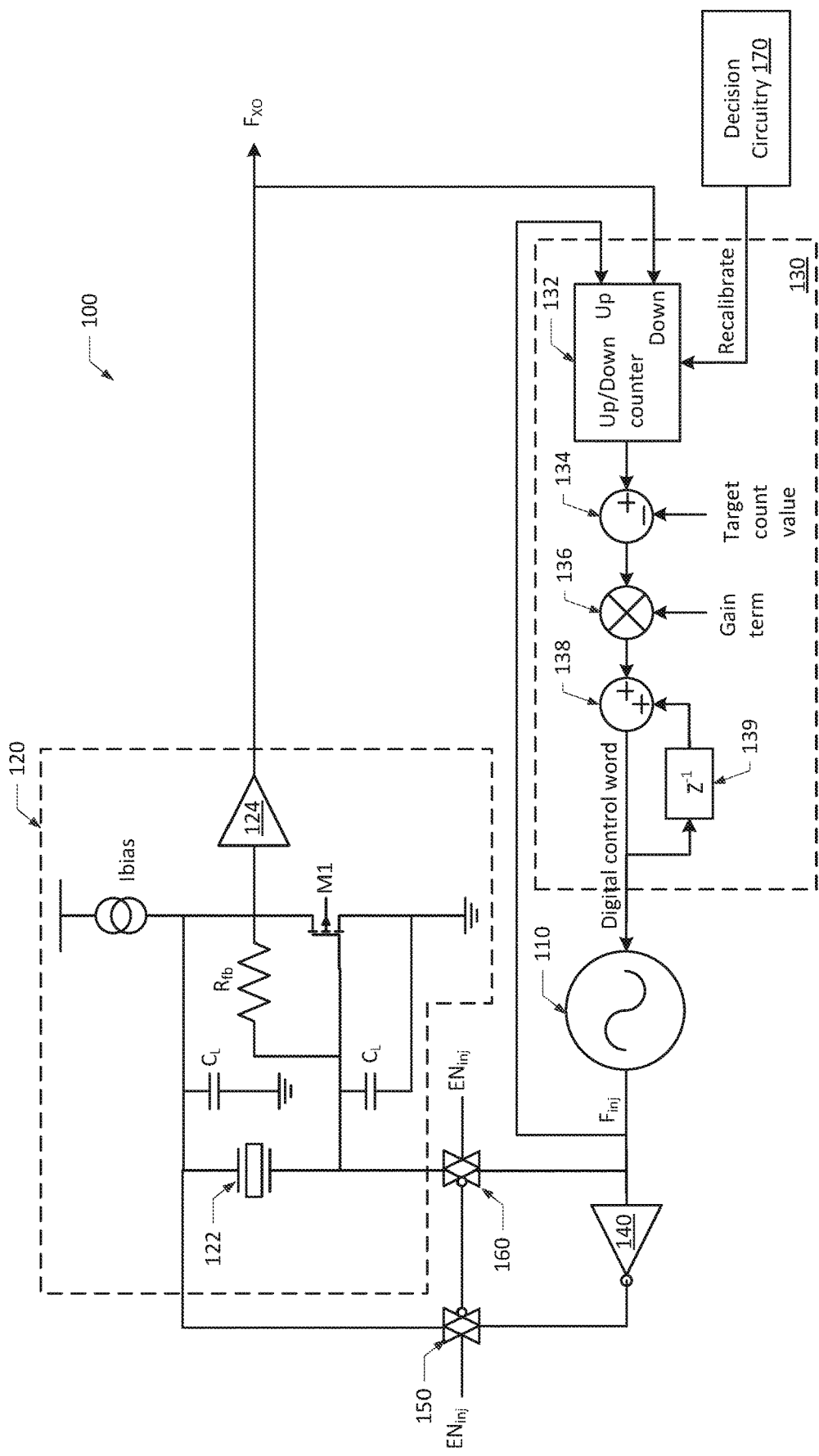
FIG. 5 is simplified circuit diagram illustrating one example implementation of a digital frequency calibration circuit, which may be included within the clock circuit shown in FIG. 4 to recalibrate the injection frequency.

FIG. 5 is simplified circuit diagram illustrating one example implementation of a digital frequency calibration circuit 130 that can be used within the clock circuit 100 shown in FIG. 4 to recalibrate the injection frequency of injection oscillator 110. In the example implementation shown in FIG. 5, digital frequency calibration circuit 130 consists entirely of digital elements (digital control logic), which are coupled to receive the resonant frequency ($F_{XO}$) generated by crystal oscillator circuit 120 and the injection frequency ($F_{inj}$) generated by injection oscillator 110 and configured to generate a digital control signal. For example, the digital elements within digital frequency calibration circuit 130 may generally include a digital up/down counter 132 followed by a plurality of arithmetic elements (e.g., subtractor 134, multiplier 136 and adder 138), which are configured to generate the digital control signal, or update the digital control signal, supplied to injection oscillator 110. Although FIG. 5 illustrates a particular combination of digital elements, it is noted that alternative combinations of digital elements and/or arithmetic algorithms may be used to generate and/or update the digital control signal in other embodiments of the present disclosure.

In the embodiment shown in FIG. 5, digital frequency calibration circuit 130 includes digital up/down counter 132, subtractor 134, multiplier 136, adder 138 and register 139. Digital up/down counter 132 is coupled to receive the resonant frequency ($F_{XO}$) and injection frequency ($F_{inj}$) and configured to generate a first digital signal corresponding to the injection frequency ($F_{inj}$) as measured by the resonant frequency ($F_{XO}$). In the particular implementation shown in FIG. 5, a first count value stored within up/down counter 132 is increased for every $F_{inj}$ clock cycle received at the up input of the up/down counter, and a second count value stored within up/down counter 132 is decreased for every $F_{XO}$ clock cycle received at the down input. The first count value is output from the up/down counter 132 when the second count value reaches zero. In other embodiments, the second count value stored within up/down counter 132 may be increased for every $F_{XO}$ clock cycle, the first count value may be decreased for every $F_{inj}$ clock cycle, and the first count value may be output from the up/down counter 132 when the second count value reaches a specified count.

Subtractor 134 is coupled to an output of digital up/down counter 132 for receiving the first count value (first digital signal), and is configured to generate a second digital signal corresponding to a difference between the count value stored within the up/down counter and a target count value supplied to the subtractor. The target count value is the count that the injection oscillator 110 would reach if it were running at exactly the desired frequency (i.e., the resonant frequency of the crystal oscillator). The output of subtractor 134 represents the frequency error between the injection frequency and the resonant frequency.

Multiplier 136 is coupled to an output of subtractor 134 and configured to generate a third digital signal by multiplying the second digital signal provided by the subtractor by a gain term supplied to the multiplier. If the first count value stored within the up/down counter 132 is greater than or less than the target count value (i.e., not equal to the target count value), the gain term is applied to the second digital signal to maps the frequency error as detected by the up/down counter to a corresponding digital code correction related to the injection oscillator, accounting for the digital format of both.

The gain term supplied to multiplier 136 can be based on design, lab measurement of the device (or chip) or a factory measurement of each individual device (or chip). In some embodiments, an average frequency/digital word conversion ratio can be measured on an average device and translated into the gain term supplied to multiplier 136. In other embodiments, a frequency/digital word conversion ratio can be measured on each manufactured device and a device-specific gain term can be stored within each separate device and supplied to multiplier 136. If the gain term is not able to be maintained as constant across the entire control range (due to limitations in the injection oscillator implementation), sub-range dependent gain terms, which are all measured on a device-device basis, can be supplied to multiplier 136.

Adder 138 is coupled to an output of multiplier 136 and configured to update the digital control signal provided to injection oscillator 110 by adding the third digital signal provided by multiplier 136 to the last digital control signal generated by the digital frequency calibration circuit 130. In some embodiments, the last digital control signal may be stored within register 139, or another volatile memory element, which is coupled to an input and output of adder 138.

The digital control signal supplied to injection oscillator 110 for recalibrating the injection frequency is a digital control word having a number of bits. In some embodiments, the digital control word may be separated into a number of coarse trim bits and a number of fine trim bits, which can be used to separately tune or adjust one or more variable components of the injection oscillator. One example implementation of an injection oscillator 110 having coarse/fine tuning is illustrated in FIG. 7 and described in more detail below.

The digital control signal supplied to injection oscillator 110 may be used to set the injection frequency ($F_{inj}$) of the injection oscillator substantially equal to the resonant frequency ($F_{XO}$) of crystal oscillator circuit 120. As used herein, "substantially equal" means that the injection frequency may be set within approximately ±0.5% of the resonant frequency. In some embodiments, the digital control signal supplied to injection oscillator 110 may provide a frequency accuracy better than ±0.5%, such as approximately ±0.2% or approximately ±0.1%.

In order to maintain the desired frequency accuracy of injection oscillator 110, digital frequency calibration circuit 130 may repeat the frequency calibration to account for frequency fluctuations over time, temperature and/or supply voltage. In some embodiments, frequency calibration may be repeated periodically over time to address low frequency noise within the injection oscillator. In some embodiments, the frequency calibration may also be repeated in response to changes in temperature and/or supply voltage to address frequency drift that occurs with changes in temperature and/or supply voltage.

As noted above, digital frequency calibration circuit 130 may update the digital control signal supplied to injection oscillator 110 upon receiving a recalibration signal (Recalibrate) from decision circuitry 170. In some embodiments, decision circuitry 170 may supply a recalibration signal to digital frequency calibration circuit 130 if a time duration since a previous update of the digital control signal exceeds a specified limit. In some embodiments, decision circuitry 170 may additionally or alternatively supply a recalibration signal to digital frequency calibration circuit 130 if a temperature associated with clock circuit 100 changes by more than a specified limit. In some embodiments, decision circuitry 170 may additionally or alternatively supply a recalibration signal to digital frequency calibration circuit 130 if a voltage supplied to clock circuit 100 changes by more than a specified limit. In some embodiments, the recalibration signal may also be supplied to injection oscillator 110 and crystal oscillator circuit 120, since each of these oscillators may need to be restarted to perform the recalibration.

Figure 6:
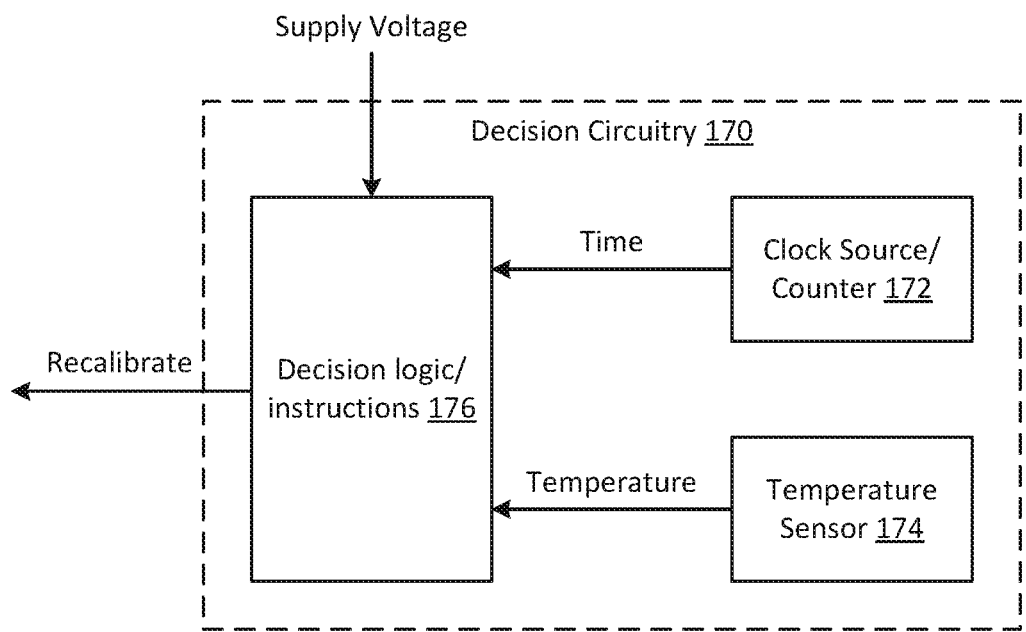
FIG. 6 is a block diagram illustrating one example implementation of a decision circuitry, which may be included within (or coupled to) the clock circuit shown in FIG. 4 to determine when to recalibrate the injection frequency.

FIG. 6 is a block diagram illustrating one example implementation of decision circuitry 170, which may be included within or coupled to the clock circuit 100 shown in FIG. 4 to determine when to recalibrate the injection frequency of the injection oscillator 110. In the example implementation shown in FIG. 6, decision circuitry 170 generally includes a clock source 172, temperature sensor 174 and decision logic (or computer program instructions) 176.

Clock source 172 is configured to track accumulation of time and may be implemented, in some embodiments, as a low frequency (e.g., 1 KHz) clock source or counter. In some embodiments, clock source 172 may be a low frequency clock source, which is typically used to maintain a source of time during sleep modes in a radio system, and thus, may consume no additional power in the radio system design. In other embodiments, clock source 172 may represent an additional clock source, which is included within or coupled to clock source 100 for providing a time count to decision logic 176. Even if an additional clock source is provided, a low frequency clock source 172 can be designed to consume 50 nA or less, thereby consuming very little power in the overall system design. In some embodiments, decision logic 176 may record the time when a frequency calibration is performed by digital frequency calibration circuit 130, and may supply a recalibration signal (Recalibrate) to the digital frequency calibration circuit (and to injection oscillator 110 and crystal oscillator circuit 120) if a time duration since the last calibration exceeds a specified limit. In such embodiments, decision logic 176 may use the time provided by clock source 172 to generate a periodic recalibration signal (e.g., once every 1 second, 10 seconds, 100 seconds, etc.). The periodic recalibration signal may then be supplied to digital frequency calibration circuit 130 (and to injection oscillator 110 and crystal oscillator circuit 120) to periodically update the digital control signal supplied to injection oscillator 110 to recalibrate the injection frequency.

Temperature sensor 174 is configured to measure a temperature associated with clock circuit 100 (or a temperature associated with a system comprising the clock circuit) and may be implemented using any known temperature sensing device. As non-limiting examples, temperature sensor 174 may be configured to measure a temperature associated with clock circuit 100 by measuring a base-to-emitter voltage (Vbe) of a bipolar transistor, measuring a delta Vbe of a bandgap core bipolar transistor pair, or by measuring a frequency change of a highly temperature sensitive oscillator compared to a temperature stable oscillator. Given low frequency sampling, the average power consumption can be quite low with many different implementations of temperature sensors. Temperature sensor 174 may be used to measure the temperature continuously or periodically (e.g., once every 1 second, 10 seconds, 100 seconds, etc.). In some embodiments, decision logic 176 may record the temperature when a frequency calibration is performed by digital frequency calibration circuit 130, and may supply a recalibration signal to the digital frequency calibration circuit (and to injection oscillator 110 and crystal oscillator circuit 120) if a current temperature measured by temperature sensor 174 differs from the previously recorded temperature by more than a specified amount (e.g., more than 1° C., 2° C. . . . 5° C., etc.). Upon receiving the recalibration signal, digital frequency calibration circuit 130 updates the digital control signal supplied to injection oscillator 110 to recalibrate the injection frequency.

Decision logic 176 is configured to determine when to recalibrate the injection frequency of the injection oscillator 110 based on at least one of: a time measurement from clock source 172, a temperature measurement from temperature sensor 174 and a voltage supplied to the clock source. As noted above, decision logic 176 may generate and supply a recalibration signal to digital frequency calibration circuit 130 (and to injection oscillator 110 and crystal oscillator circuit 120) if a time duration since the last frequency calibration exceeds a specified limit. In some embodiments, decision logic 176 may generate and supply a recalibration signal to digital frequency calibration circuit 130 (and to injection oscillator 110 and crystal oscillator circuit 120) if a temperature associated with the clock circuit (or a system) or a voltage supplied to the clock circuit changes by more than a specified amount. In some embodiments, decision logic 176 may include one or more registers for storing digital values corresponding to a previous time, temperature and/or supply voltage at which the injection oscillator 110 was last calibrated, and one or more digital comparators for comparing a current time, temperature and/or supply voltage with the corresponding digital values stored within the registers.

Decision circuitry 170 tracks the accumulation of time, and in some embodiments, checks for changes in temperature and/or supply voltage, in both active and low power modes of a system (e.g., a radio system) at very low cost in power. When transitioning from a low power mode, crystal oscillator circuit 120 may be started and digital frequency calibration circuit 130 may be used to recalibrate the injection frequency of injection oscillator 110. Depending on average duty cycle, the cost of performing the recalibration and other considerations, it may also be desirable to perform the frequency recalibration periodically at a higher rate while in the system is in an active or high power mode, and/or before exiting an active or high power mode, to reduce the frequency that the system is forced to wake up from a low power mode to perform recalibrations.

As illustrated in FIGS. 4 and 5 and disclosed above, the present disclosure provides a digital frequency recalibration scheme, which may be used to periodically recalibrate the injection frequency of an injection oscillator coupled to kick-start a crystal oscillator circuit. As long as the time duration (and/or change in temperature or supply voltage) between frequency recalibrations is bounded, the digital frequency recalibration scheme disclosed herein may be used to maintain a high frequency accuracy of the injection frequency (e.g., within 0.1% or 0.2% of the resonant frequency). This allows much more energy to be injected into the crystal oscillator circuit during start-up, thereby achieving faster and more predictable start-up times. In preferred embodiments, it is necessary to provide both time keeping and temperature sensing at all times, including during low power modes. Alternatively, the clock circuit may be specified to the customer to support only a certain rate of change of temperature over time, in which case only time keeping is needed and temperature sensing may be omitted.

Unlike the PLL implementation disclosed in the '354 patent, the digital frequency recalibration scheme disclosed herein maintains high frequency accuracy of the injection frequency, while consuming very little power in the overall system design. As a reference, a sleep power dominated radio system may consume approximately 1-2 micro-Amps (uA, $10^{-6}$ A) if it is a very good design. By implementing the digital frequency recalibration scheme disclosed herein, it is possible to maintain approximately 0.1% frequency accuracy for up to 100 seconds (and/or up to a 5° C. change in temperature, which in itself should be an infrequent event). If the crystal oscillator circuit consumes 1 milli-Amperes (mA, $10^{-3}$ A) of current, and frequency recalibration is done in 1 millisecond (ms, $10^{-3}$ sec) (nominally offering 0.01% calibration resolution with a 10 MHz injection clock), the average power consumed by digital frequency calibration circuit 130 to periodically recalibrate the injection frequency every 100 seconds is roughly 10 nano-Amperes (nA, $10^{-9}$ A). This power consumption may be even less if the radio system wakes up on a more frequent basis, and frequency recalibration is performed during regularly scheduled radio intervals. In addition, it is common for radio systems to include a low power sleep clock and temperature sensor. In such systems, decision circuitry 170 may track time and temperature changes without consuming any extra power in the radio system design. If needed, however, an additional clock source 172 (e.g., 1 KHz) consuming approximately 50 nA or less and/or an additional temperature sensor 174 consuming approximately 10 nA or less could be included within the decision circuitry 170.

In addition, the digital frequency recalibration scheme disclosed herein utilizes a much simpler frequency control loop than the PLL implementation disclosed in the '354 patent to recalibrate the injection frequency of the injection oscillator. As noted above, digital frequency calibration circuit 130 uses only simple digital elements to measure the frequency difference between the resonant frequency ($F_{xo}$) and the injection frequency ($F_{inj}$) and calculate an updated digital control signal. The digital elements used within digital frequency calibration circuit 130 are easy to design, consume very little area and have negligible cost in power consumption.

One challenge with implementing a simple frequency control loop, as disclosed herein, is that the injection oscillator must have a stable and linear relationship between change in frequency and change in the digital control signal supplied thereto. One example of an injection oscillator having such a relationship is an RC based relaxation oscillator that can separate its frequency control word (digital control signal) into coarse and fine trim bits. The coarse trim bits, which have a wider range of frequency tuning, can be used to account for chip-to-chip frequency variation. In some embodiments, the coarse trim bits may be determined on a one-time basis during factory calibration and may be stored within a one-time programmable register. The fine trim bits, which have a much smaller range of frequency tuning, may be used within the digital frequency recalibration scheme disclosed herein to recalibrate the injection frequency of the injection oscillator. Because the tuning range of the fine trim bits is much narrower, the required stable and linear relationship is easier to maintain.

FIG. 7 is a block diagram illustrating one example implementation of an injection oscillator 110 that may be included within the clock circuit 100 shown in FIG. 4. In the illustrated embodiment, the digital control word supplied to injection oscillator 110 is separated into a number of coarse trim bits and a number of fine trim bits, which are used to separately tune or adjust one or more variable components of the injection oscillator. Injection oscillator 110 is illustrated in FIG. 7 as an RC oscillator having a variable capacitor 112, variable resistor 114, reference voltage source 116, comparator 118 and switches S1 and S2. In one embodiment, the capacitance of variable capacitor 112 may be controlled by the coarse trim bits, and the resistance of variable resistor 114 may be controlled by the fine trim bits of the digital control word. In another embodiment, the capacitance of variable capacitor 112 may be controlled by the fine trim bits, and the resistance of variable resistor 114 may be controlled by the coarse trim bits of the digital control word.

Switches S1 and S2 drive the basic oscillation behavior of the injection oscillator 110. When S1 is conducting, the RC based input (i.e., a slow moving input) to the comparator 118 will tend to rise. In this state, the higher tap point in the resistor ladder of variable resistor 114 is selected for comparison with Vref. When the RC based input rises above Vref, the output of comparator 118 will flip and turn off S1 and turn on S2. This causes the slow moving RC based comparator input to start to fall. At the same time, the lower tap point in the resistor ladder of variable resistor 114 is selected for comparison with Vref (which updates at the comparator input very quickly). When the slow moving RC based comparator input drops below Vref, the comparator 118 trips again and the switches return to their original state (i.e., S1 on and S2 off).

In one embodiment, variable resistor 114 may be used to charge variable capacitor 112 up/down each cycle with a reference voltage (Vref) that changes direction each half cycle to produce an oscillating signal. However, an oscillating signal can also be generated by charging the variable resistor 114 in one direction each cycle and resetting the oscillator by discharging variable capacitor 112. Since the oscillation frequency of the RC oscillator is inversely proportional to the RC time constant, the oscillation frequency increases with decreasing resistive and capacitive values and decreases with increasing resistive and capacitive values. Comparator 118 compares the oscillating signal provided by resistor 114 and capacitor 112 with the reference voltage (Vref) to generate the injection frequency ($F_{inj}$). It is noted that FIG. 7 illustrates only one way an RC oscillator having coarse/fine trim bits may be implemented. In other embodiments (not shown herein), comparator 118 may be replaced with an inverter and the reference voltage generation path may be eliminated. Other RC oscillator circuit implementations, which separate the frequency control word (digital control signal) into coarse and fine trim bits are also contemplated herein.

In all embodiments, injection oscillator 100 functions as a digital-to-analog converter (DAC) having coarse/fine trim bits. Separating the coarse/fine trim bits, and tuning variable capacitor 112 and variable resistor 114 separately, creates sub-ranging on the DAC and makes the DAC easier to design and the frequency calibration simpler. For example, it is generally desirable for the smallest trim step of the DAC to be significantly less than the target frequency accuracy of the injection oscillator. If the frequency accuracy target were 0.1%, an 11 bit DAC would be needed to provide a frequency step of 0.025%. Such a DAC is relatively hard to design as part of an oscillator and would consume a significant amount of silicon area and power. Separating the coarse/fine trim bits enables the coarse trim bits to be used to account for process variation (which could be up to ±30%), while the fine trim bits are used to account for time (aging), temperature and supply variation (which may be only about ±3%). A frequency variation of ±3% may be handled with a DAC having, for example, only 7 or 8 bits, which is much easier to design and implement.

In some embodiments, the coarse trim bits may be determined during factory calibration and stored within non-volatile memory, and the fine trim bits may be supplied to the injection oscillator as the digital control signal, which is used to adjust the injection frequency of the injection oscillator. If non-volatile memory is not available, a coarse calibration may be performed by the digital frequency calibration circuit each time the clock circuit is powered up to provide the coarse trim bits, and a fine calibration can be performed over variations in time, temperature and/or supply voltage to provide the fine trim bits. If the fine trim bits cannot handle the frequency variation over the full range of time (aging), temperature and/or supply voltage, a multi-step calibration process with multiple measurement and update cycles can be used in some cases to adjust the coarse trim bits supplied to the injection oscillator.

Figure 8:
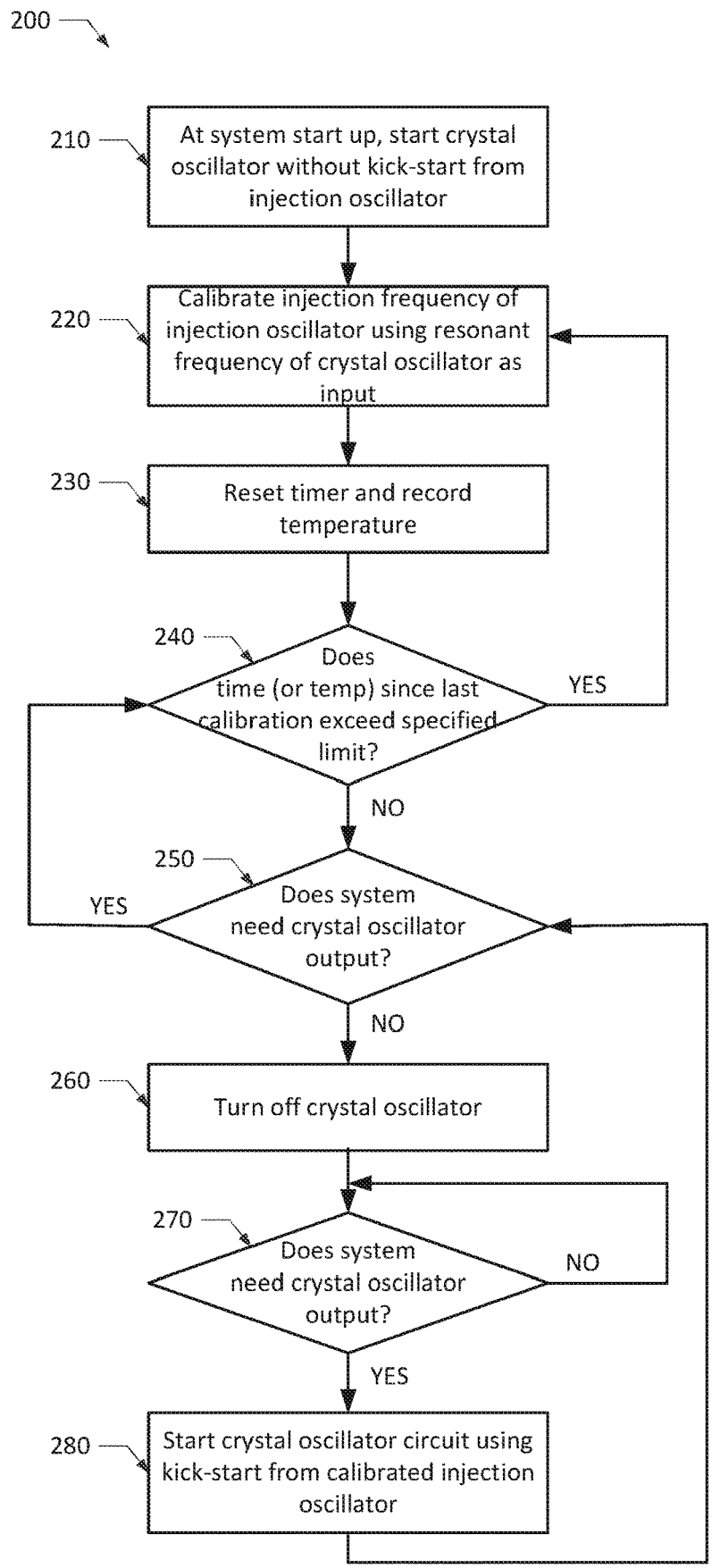
FIG. 8 is a flow chart diagram illustrating one embodiment of a method to operate a crystal oscillator circuit having an injection oscillator coupled thereto.
Figure 9:
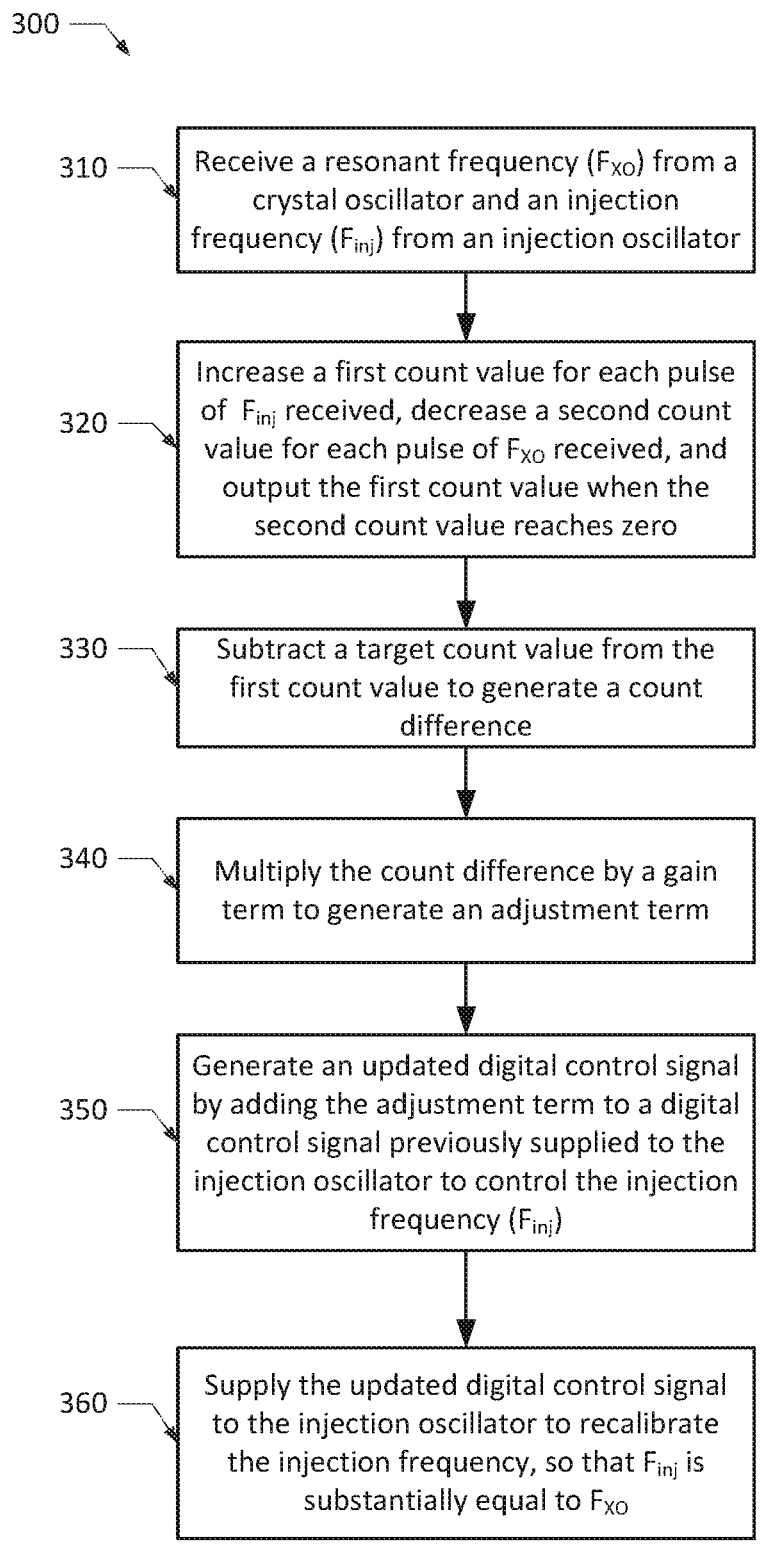
FIG. 9 is a flow chart diagram illustrating one embodiment of a method to recalibrate an injection oscillator coupled to a crystal oscillator circuit.

FIG. 8 is a flow chart diagram illustrating one embodiment of a method 200 that may be used to operate a crystal oscillator circuit having an injection oscillator coupled thereto. In some embodiments, the method shown in FIG. 8 may begin at system start-up (in step 210) when the crystal oscillator circuit is started without a kick-start from the injection oscillator. In step 220, the injection frequency ($F_{inj}$) of the injection oscillator is calibrated using the resonant frequency ($F_{XO}$) of the crystal oscillator circuit as an input. One embodiment a method 300 that may be used in step 220 to calibrate the injection frequency of the injection oscillator is illustrated in FIG. 9 and described in more detail below. Once the injection frequency is calibrated, the method may reset a timer and record a temperature (in step 230).

In step 240, the method may access the timer to determine if a time duration since the injection frequency was last calibrated exceeds a first specified limit (e.g., 1 second, 10 seconds, 100 seconds, etc.). In some embodiments, the method may also access a temperature measurement from a temperature sensor to determine if a temperature change since the injection frequency was last calibrated exceeds a second specified limit (e.g., 1° C., 2° C. . . . , 5° C. etc.) in step 240. If the time and/or temperature exceeds a corresponding limit (YES branch of step 240), method steps 220 and 230 may be repeated to recalibrate the injection frequency of the injection oscillator and reset the time and temperature of the last calibration.

In some embodiments, the crystal oscillator circuit may be turned off (in step 260) if the system does not need the crystal oscillator output (NO branch of step 250), such as when the system transitions to a low power sleep mode. The next time the system needs the crystal oscillator output (YES branch of step 270), the injection frequency of the injection oscillator, which was calibrated in step 220, may be supplied to the crystal oscillator circuit to kick-start the crystal oscillator (in step 280). The start-up time of the crystal oscillator circuit is reduced, due to the circuits and methods used herein to maintain high frequency accuracy of the injection frequency (e.g., within 0.1% or 0.2% of the resonant frequency) over time and temperature.

The start-up time may generally depend on the crystal size and frequency, as well as the threshold used for defining end of startup time. For a 38 MHz crystal, for example, the start-up time of a crystal oscillator circuit with no kick start circuit may be approximately 300 us. With the kick start circuit shown in FIGS. 4 and 5 tuned to at least 0.25% of the resonant frequency of the crystal oscillator, and a start-up time defined to be a minimum of oscillation amplitude and 40 ppm settling of the resonant frequency, the start-up time may be reduced to approximately 30 us, or 10× improvement. In comparison, the modulation based kick start schemes shown in FIGS. 1-3 provide a start-up time of about 64 us with a 48 MHz resonant frequency (which usually gives faster start-up time), thus providing only a 5-7× start-up time improvement with a modulated approach (as compared to a crystal oscillator circuit with no kick start circuit).

FIG. 9 is a flow chart diagram illustrating one embodiment of a method 300 that may be used (in step 220 of FIG. 8) to recalibrate an injection oscillator coupled to a crystal oscillator circuit. In step 310, the method shown in FIG. 9 receives an injection frequency of an injection oscillator and a resonant frequency of a crystal oscillator circuit. In step 320, the method increases a first count value for each pulse of the injection frequency received during the receiving step, decreases a second count value for each pulse of the resonant frequency received during the receiving step, and outputs the first count value when the second count value reaches zero. In other embodiments, the method may increase the second count value for each pulse of the resonant frequency received, decrease the first count value for each pulse of the injection frequency received, and output the first count value when the second count value reaches a specified count.

In step 330, the method subtracts a target count value from the first count value to generate a count difference. In step 340, the method multiplies the count difference by a gain term to generate an adjustment term. In step 350, the method generates an updated digital control signal by adding the adjustment term to a digital control signal previously supplied to the injection oscillator to control the injection frequency. In step 360, the method supplies the updated digital control signal to the injection oscillator to recalibrate the injection frequency, so that the injection frequency of the injection oscillator is substantially equal to the resonant frequency of the crystal oscillator circuit.

In some embodiments, steps 310-360 may be repeated if a time duration since the injection frequency was last calibrated exceeds a first specified limit (e.g., 1 second, 10 seconds, 100 seconds, etc.), and/or if a temperature change since the injection frequency was last calibrated exceeds a second specified limit (e.g., 1° C., 2° C. . . . , 5° C. etc.). Although not shown in FIG. 9, some embodiments of the method may include resetting a time count upon supplying the updated digital control signal to the injection oscillator to recalibrate the injection frequency of the injection oscillator, and repeating steps 310-360 when the time count exceeds the first specified limit. Some embodiments of the method may also include recording a temperature upon supplying the updated digital control signal to the injection oscillator to recalibrate the injection frequency of the injection oscillator, and repeating steps 310-360 if the temperature changes more than the second specified limit.

Figure 10:
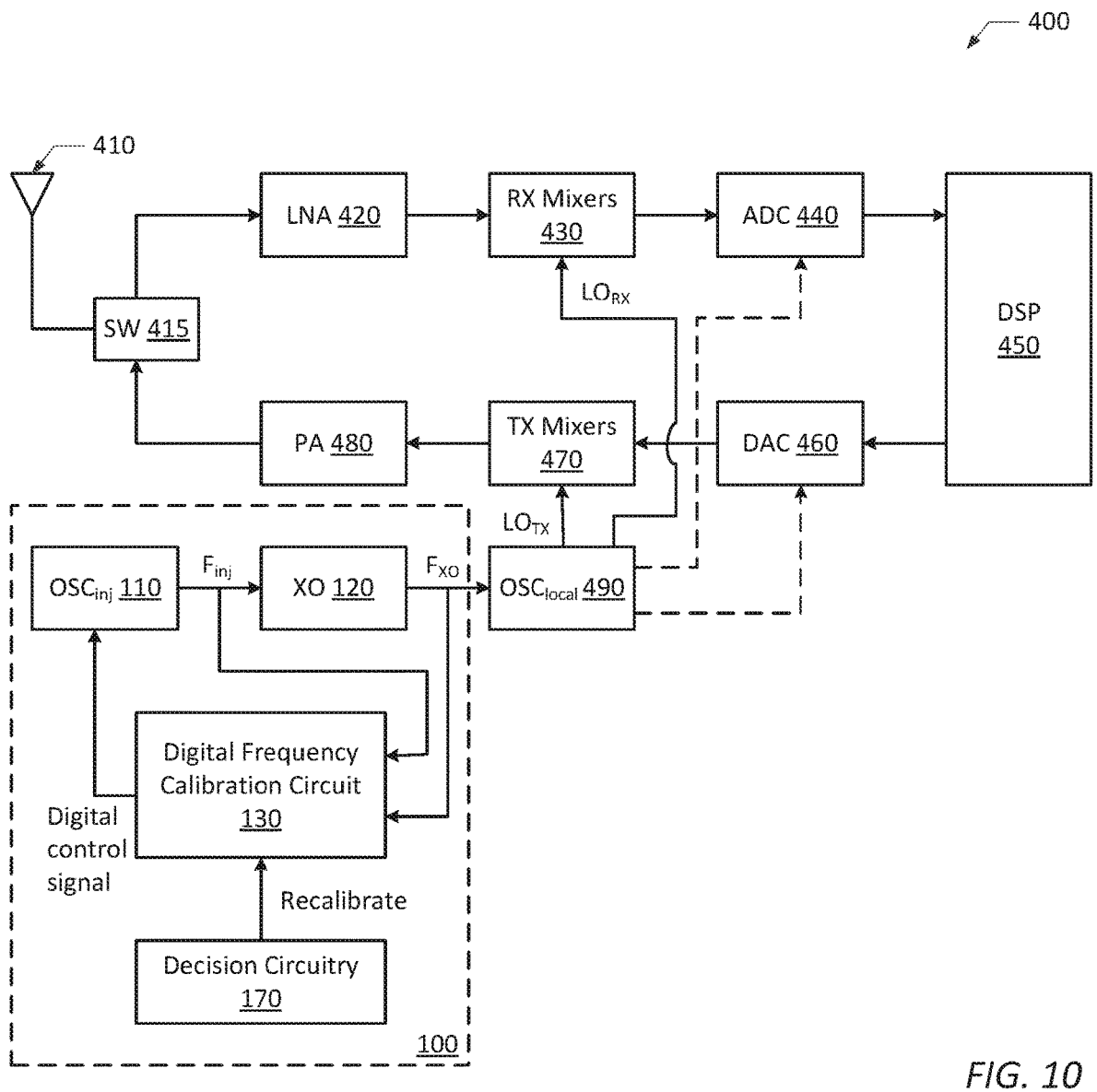
FIG. 10 is a block diagram illustrating one embodiment of a radio frequency (RF) transceiver in which the clock circuit shown in FIG. 4 may be used to provide a fast starting clock signal to one or more components of the RF transceiver.

FIG. 10 is a block diagram illustrating one embodiment of a radio frequency (RF) transceiver 400 in which the clock circuit 100 shown in FIGS. 4-5 may be used to provide a fast starting clock signal to one or more components of the RF transceiver. The RF transceiver 400 shown in FIG. 10 includes a receive (RX) path and a transmit (TX) path, each of which may be coupled to an RF antenna 410 via a switch 415. When an RF signal is received by antenna 410, the received RF signal is routed through switch 415 to the RX path of the RF transceiver, which in one embodiment, may include a first RF amplifier 420, a pair of RX mixers 430 and an analog-to-digital converter (ADC) 440. The first RF amplifier 420 (e.g., a low noise amplifier, LNA) amplifies the received RF signal and supplies the amplified RF signal to a pair of RX mixers 430. RX mixers 430 combine the amplified RF signal with a mixing signal ($LO_{RX}$) from a local oscillator ($OSC_{local}$) 490 (e.g., a voltage controlled oscillator, VCO) to down-convert the frequency of the received RF signal to a lower frequency. The down-converted signal is digitized by analog-to-digital converter (ADC) 440 before it is supplied to a processor 450 (e.g., a digital signal processor, DSP) for demodulation and further processing.

In the illustrated embodiment, the TX path of RF transceiver 400 includes a digital-to-analog converter (DAC) 460, a pair of TX mixers 470 and a second RF amplifier 480. To transmit an RF signal, processor 450 supplies a modulated digital signal to DAC 460 for conversion to an analog transmit signal. The analog transmit signal is supplied to TX mixers 470, which combine the analog transmit signal with a mixing signal ($LO_{TX}$) from local oscillator 490 to up-convert the frequency of the analog transmit signal to a higher frequency. The up-converted signal is supplied to the second RF amplifier 480 (e.g., a power amplifier, PA) for amplification before it is transmitted, via switch 415, by antenna 410.

As shown in FIG. 10, the clock circuit 100 shown in FIGS. 4-5 may be coupled to provide a reference clock signal at a resonant frequency ($F_{XO}$) to local oscillator 490 for generating the mixing signals ($LO_{RX}$ and $LO_{TX}$) supplied to the RX and TX mixers 430 and 470. In some embodiments, the local oscillator 490 may also use the reference clock signal provided by clock circuit 100 to provide a local clock signal to ADC 440 and/or DAC 460. Providing clock circuit 100 with the digital frequency calibration circuit 130 and decision circuitry 170 discussed above enables injection oscillator ($OSC_{inj}$) 110 to provide an injection frequency ($F_{inj}$) to crystal oscillator (XO) 120 that remains substantially consistent over variations in time, temperature and/or supply voltage. This enables crystal oscillator (XO) 120 to quickly start-up and provide a reference clock signal to local oscillator 490 for generating the local clock signals and mixing signals used by the RF transceiver 400.

It will be appreciated to those skilled in the art having the benefit of this disclosure that this disclosure is believed to provide embodiments of improved clock circuits and methods to recalibrate an injection oscillator used to kick-start a crystal oscillator circuit. It is to be understood that the various embodiments of the clock circuit and methods described herein are to be taken as presently preferred embodiments. Further modifications and alternative embodiments of various aspects of the disclosure will be apparent to those skilled in the art in view of this description. Elements and materials may be substituted for those illustrated and described herein, parts and processes may be reversed, and certain features of the disclosed embodiments may be utilized independently, all as would be apparent to one skilled in the art after having the benefit of this disclosure. It is intended, therefore, that the following claims be interpreted to embrace all such modifications and changes and, accordingly, the specification and drawings are to be regarded in an illustrative rather than a restrictive sense.

What is claimed is:

1. A clock circuit, comprising:
a crystal oscillator circuit configured to generate a clock signal at a resonant frequency;
an injection oscillator coupled to supply an oscillation signal at an injection frequency to the crystal oscillator circuit to reduce a start-up time of the crystal oscillator circuit; and
a digital frequency calibration circuit coupled to receive the resonant frequency and the injection frequency as inputs, and configured to supply a digital control signal to the injection oscillator to set the injection frequency of the injection oscillator substantially equal to the resonant frequency of the crystal oscillator circuit;
wherein the digital frequency calibration circuit comprises a digital up/down counter coupled to receive the resonant frequency and the injection frequency; and
wherein the digital up/down counter is configured to generate a first digital signal based upon an increasing count value and a decreasing count value corresponding to the injection frequency as measured by the resonant frequency.

2. The clock circuit as recited in claim 1, wherein the digital frequency calibration circuit comprises digital control logic, which is coupled to receive the resonant frequency and the injection frequency and configured to generate the digital control signal.

3. The clock circuit as recited in claim 1, wherein the digital frequency calibration circuit is configured to set the injection frequency of the injection oscillator equal to the resonant frequency of the crystal oscillator circuit with a frequency accuracy better than ±0.25%.

4. The clock circuit as recited in claim 1, further comprising decision circuitry coupled for supplying a recalibration signal to the digital frequency calibration circuit to update the digital control signal supplied to the injection oscillator.

5. The clock circuit as recited in claim 4, wherein the decision circuitry is configured to supply the recalibration signal to the digital frequency calibration circuit if a time duration since a previous update of the digital control signal exceeds a specified limit.

6. The clock circuit as recited in claim 4, the decision circuitry is configured to supply the recalibration signal to the digital frequency calibration circuit if a temperature change associated with the clock circuit exceeds a specified limit.

7. The clock circuit as recited in claim 1, wherein the injection oscillator comprises an RC oscillator including a variable capacitor and a variable resistor, wherein a capacitance of the variable capacitor is controlled by a first set of trim bits, and wherein a resistance of the variable resistor is controlled by a second set of trim bits.

8. A clock circuit, comprising:
a crystal oscillator circuit configured to generate a clock signal at a resonant frequency;
an injection oscillator coupled to supply an oscillation signal at an injection frequency to the crystal oscillator circuit to reduce a start-up time of the crystal oscillator circuit; and
a digital frequency calibration circuit coupled to receive the resonant frequency and the injection frequency as inputs, and configured to supply a digital control signal to the injection oscillator to set the injection frequency of the injection oscillator substantially equal to the resonant frequency of the crystal oscillator circuit;
wherein the digital frequency calibration circuit further comprises a subtractor coupled to an output of the digital up/down counter, wherein the subtractor is configured to generate a second digital signal corresponding to a difference between the first digital signal and a target count value supplied to the subtractor.

9. The clock circuit as recited in claim 8, wherein the digital frequency calibration circuit further comprises a multiplier coupled to an output of the subtractor, wherein the multiplier is configured to generate a third digital signal by multiplying the second digital signal by a gain term supplied to the multiplier.

10. The clock circuit as recited in claim 9, wherein the digital frequency calibration circuit further comprises an adder coupled to an output of the multiplier, wherein the adder is configured to update the digital control signal by adding the third digital signal to the digital control signal.

11. A clock circuit, comprising:
a crystal oscillator circuit configured to generate a clock signal at a resonant frequency;
an injection oscillator coupled to supply an oscillation signal at an injection frequency to the crystal oscillator circuit to reduce a start-up time of the crystal oscillator circuit; and
a digital frequency calibration circuit coupled to receive the resonant frequency and the injection frequency as inputs, and configured to supply a digital control signal to the injection oscillator to set the injection frequency of the injection oscillator substantially equal to the resonant frequency of the crystal oscillator circuit;
wherein the injection oscillator comprises an RC oscillator including a variable capacitor and a variable resistor, wherein a capacitance of the variable capacitor is controlled by a first set of trim bits, and wherein a resistance of the variable resistor is controlled by a second set of trim bits; and
wherein one of the first and second sets of trim bits is determined either during factory calibration and stored within non-volatile memory or by the digital frequency calibration circuit each time the clock circuit is started, and wherein the other of the first and second set of trim bits is supplied to the injection oscillator as the digital control signal.

12. A method for recalibrating an injection frequency supplied by an injection oscillator to a crystal oscillator circuit, the method comprising:
receiving the injection frequency of the injection oscillator and a resonant frequency of the crystal oscillator circuit;
increasing a first count value for each pulse of the injection frequency received during the receiving step, decreasing a second count value for each pulse of the resonant frequency received during the receiving step, and outputting the first count value when the second count value reaches zero;
subtracting a target count value from the first count value to generate a count difference;
multiplying the count difference by a gain term to generate an adjustment term;
generating an updated digital control signal by adding the adjustment term to a digital control signal previously supplied to the injection oscillator to control the injection frequency; and
supplying the updated digital control signal to the injection oscillator to recalibrate the injection frequency, so that the injection frequency of the injection oscillator is substantially equal to the resonant frequency of the crystal oscillator circuit.

13. The method as recited in claim 12, wherein the steps of receiving, increasing/decreasing/outputting, subtracting, multiplying, generating and supplying are repeated in response to at least one of the following:
   a time duration since the injection frequency was last calibrated exceeds a first specified limit;
   a temperature change since the injection frequency was last calibrated exceeds a second specified limit; and
   a supply voltage change since the injection frequency was last calibrated exceeds a third specified limit.

14. The method as recited in claim 12, further comprising resetting a time count upon supplying the updated digital control signal to the injection oscillator to recalibrate the injection frequency of the injection oscillator, and repeating the method steps when the time count exceeds a specified limit.

15. The method as recited in claim 12, further comprising recording a temperature upon supplying the updated digital control signal to the injection oscillator to recalibrate the injection frequency of the injection oscillator, and repeating the method steps if the temperature changes more than a specified limit.

16. A transceiver circuit, comprising:
   a clock circuit coupled to generate a clock signal, the clock signal comprising:
      a crystal oscillator circuit configured to generate a clock signal at a resonant frequency;
      an injection oscillator coupled to supply an oscillation signal at an injection frequency to the crystal oscillator circuit to reduce a start-up time of the crystal oscillator circuit; and
      a digital frequency calibration circuit coupled to receive the resonant frequency and the injection frequency as inputs, and configured to supply a digital control signal to the injection oscillator to set the injection frequency of the injection oscillator substantially equal to the resonant frequency of the crystal oscillator circuit;
   wherein the digital frequency calibration circuit comprises:
      a digital up/down counter, which is coupled to receive the resonant frequency and the injection frequency and configured to generate a first digital signal corresponding to the injection frequency as measured by the resonant frequency;
      a subtractor, which is coupled to an output of the digital up/down counter and configured to generate a second digital signal corresponding to a difference between the first digital signal and a target count value supplied to the subtractor;
      a multiplier, which is coupled to an output of the subtractor and configured to generate a third digital signal by multiplying the second digital signal by a gain term supplied to the multiplier; and
      an adder, which is coupled to an output of the multiplier and configured to update the digital control signal by adding the third digital signal to the digital control signal; and
   a local oscillator coupled to receive the clock signal generated by the clock circuit and configured to use the clock signal as a reference clock signal for generating one more local clock signals.

17. The transceiver circuit as recited in claim 16, wherein the transceiver circuit comprises:
   a receive (RX) path including a first amplifier, a pair of RX mixers and an analog-to-digital converter (ADC); and
   a transmit (TX) path including a digital-to-analog converter (DAC), a pair of TX mixers and a second amplifier; and
   wherein the local oscillator is coupled for supplying the one or more local clock signals to one or more of the RX mixers, TX mixers, ADC and DAC.

18. The transceiver circuit as recited in claim 16, wherein the digital frequency calibration circuit consists of digital control logic, which is coupled to receive the resonant frequency and the injection frequency and configured to generate the digital control signal.

19. The transceiver circuit as recited in claim 16, further comprising decision circuitry, which is coupled to supply a recalibration signal to the digital frequency calibration circuit to update the digital control signal supplied to the injection oscillator.

20. The transceiver circuit as recited in claim 19, wherein the decision circuitry is configured to supply the recalibration signal to the digital frequency calibration circuit in response to at least one of the following:
   a time duration since the injection frequency was last calibrated exceeds a first specified limit; and
   a temperature change since the injection frequency was last calibrated exceeds a second specified limit; and
   a supply voltage change since the injection frequency was last calibrated exceeds a third specified limit.

* * * * *